United States Patent
Wu et al.

(10) Patent No.: US 6,578,177 B2
(45) Date of Patent: Jun. 10, 2003

(54) METHOD TO IMPROVE ISOLATION LAYER FILL IN A DRAM ARRAY AREA

(75) Inventors: Joseph Wu, Hsinchu (TW); Yu-Ping Chu, Kaoshiung (TW)

(73) Assignee: ProMos Technologies, Hsin-Chu (TW)

( * ) Notice: Subject to any disclaimer, the term of this patent is extended or adjusted under 35 U.S.C. 154(b) by 59 days.

(21) Appl. No.: 09/928,060

(22) Filed: Aug. 13, 2001

(65) Prior Publication Data

US 2003/0033579 A1 Feb. 13, 2003

(51) Int. Cl.[7] ............................................... G06F 17/50
(52) U.S. Cl. ......................................................... 716/2
(58) Field of Search .............................. 716/1, 19, 20, 716/21; 438/303; 257/315, 316

(56) References Cited

U.S. PATENT DOCUMENTS

| | | | |
|---|---|---|---|
| 5,553,273 A | 9/1996 | Liebmann | 395/500 |
| 5,663,017 A | 9/1997 | Schinella et al. | 430/5 |
| 5,851,890 A | * 12/1998 | Tsai et al. | 438/303 |
| 6,056,783 A | * 5/2000 | Yoo et al. | 716/19 |
| 6,060,368 A | 5/2000 | Hashimoto et al. | 438/401 |

* cited by examiner

Primary Examiner—Matthew S. Smith
Assistant Examiner—Thuan Do
(74) Attorney, Agent, or Firm—George O. Saile; Stephen B. Ackerman; Douglas R. Schnabel

(57) ABSTRACT

A new method of forming gate conductor lines for a DRAM in the manufacture of an integrated circuit device has been achieved. A semiconductor substrate is provided. Active areas are defined. A gate conductor layer is deposited overlying the semiconductor substrate. The gate conductor layer is patterned to form gate conductor lines. The intersections of the gate conductor lines and the active areas form DRAM transistors. Adjacent gate conductor lines are spaced a first minimum distance in critical regions and are spaced a second minimum distance in non-critical regions. The critical regions are defined as the active areas between adjacent gate conductor lines where bit line contacts are planned. The non-critical regions are defined as areas located between the critical regions and the adjacent gate conductor lines. The second minimum distance is greater than the first minimum distance to thereby decrease the aspect ratio in the non-critical regions to less than the aspect ratio in the critical regions. An insulating layer is deposited overlying the gate conductor lines and the semiconductor substrate. The insulating layer completely fills the non-critical regions without creating voids to thereby eliminate bit line contact to bit line contact shorts without affecting transistor performance.

20 Claims, 4 Drawing Sheets

METHOD TO IMPROVE ISOLATION LAYER FILL IN A DRAM ARRAY AREA

BACKGROUND OF THE INVENTION (1) Field of the Invention

The invention relates to a method to form a DRAM memory device, and more particularly, to a method to improve isolation layer filling in a DRAM array in the manufacture of an integrated circuit device.

(2) Description of the Prior Art

DRAM memory circuits are a basic building block for many electronic systems. A DRAM memory contains an array of densely-packed transistors with each transistor containing a charge storage capacitor. Packing density is a critical parameter in profitably producing DRAM circuits in a fiercely competitive marketplace. As manufacturers attempt to pack greater numbers of storage cells and connective lines into smaller die areas, many manufacturing challenges must be overcome.

Referring now to FIG. 1, a top view of a section of a partially completed DRAM memory circuit is shown. In this illustration, several features of a typical DRAM memory layout are depicted. First, active areas 10 and 22 are formed in the semiconductor substrate. Two gate conductor lines 14 overlie the semiconductor substrate and the active areas 10 and 22. Note particularly that the gate conductor lines 14 intersect the middle active areas 10 and form transistors. These gate conductor lines 14 are typically formed from polysilicon and may additionally contain sidewall spacers of, for example, silicon nitride or silicon dioxide to facilitate the formation of drain extensions.

In a typical DRAM cell design, the active areas are electrically isolated from each other. These active areas are ion implanted to form source and drain junctions for the cell transistors. To provide electrical connectivity to each bit line from the active area, bit line contacts 18 are made through any overlying isolation layer to each of the middle active areas 10 in the region between the adjacent gate conductor lines 14.

Note especially the area 26 between the two adjacent gate conductor lines 14 and the two adjacent bit line contacts 18. Two cross sectional representations of this area are illustrated in FIGS. 2 and 3.

Referring now particularly to FIG. 2, a first cross section is shown. The two adjacent gate conductor lines 14 are shown. Each gate conductor line 14 has sidewall spacers 30. After the DRAM transistor cells are formed, an insulating layer 34 is deposited overlying the semiconductor substrate 28 and the gate conductor lines 14 as shown. This insulating layer 34 may comprise any number of insulating materials, such as borophosphosilicate glass (BPSG).

By depositing a doped silicon dioxide material, it is easier to fill the very small space between the adjacent gate conductor lines 14. The aspect ratio of the gap is defined as the depth L2 of the gap divided by the width L1 of the gap. As DRAM designs and process technologies become smaller, the aspect ratio (L2/L1) becomes greater, especially in the bit line contact area. It becomes increasingly difficult, therefore, to completely fill the gap between the gate conductors 14. Keyholes or voids 38 can form in the critical area between the gate conductor lines as shown. These voids in the insulating layer 34 are not necessarily a problem because the air trapped in the voids can also act as an insulating material.

Referring now to FIG. 3, an alternative cross-section of the device is shown. In this cross-section, the adjacent middle bit lines 10 are highlighted. This cross section shows why the void 38 is a particular problem in this case. The void 38 forms a channel between the bit line contacts 18 for the adjacent active areas 10. When a conductive layer, such as polysilicon, is subsequently deposited to provide electrical connectivity, the two adjacent active areas 10 will be shorted together. This will result in a useless DRAM circuit.

Several prior art approaches disclose methods that use optical proximity correction (OPC) in the manufacture of integrated circuits. U.S. Pat. No. 6,060,368 to Hashimoto et al discloses an OPC-based method for correcting the dimensions of multiple material transistor gates. Specifically, buried channel MOS devices, some with n+ type polysilicon gates and some with p+ type polysilicon gates, may be simultaneously patterned. The OPC method independently corrects the polysilicon mask pattern for the n+ and the p+ regions by using correction tables. U.S. Pat. No. 5,663,017 to Schinella et al teaches a method and an apparatus to form large-scale integrated circuits fields comprising smaller, sub-fields. Sub-fields may be lithographically processed using independent processes and then stitched together. The method discloses use of OPC or of phase-shifting OPC. U.S. Pat. No. 5,553,273 to Liebmann shows an OPC method for gate arrays to reduce the critical dimension in selected areas.

SUMMARY OF THE INVENTION

A principal object of the present invention is to provide a very manufacturable method to form DRAM memory circuits in the manufacture of an integrated circuit device.

Another principal object of the present invention is to provide a very manufacturable DRAM transistor array device.

A further object of the present invention is to provide a method to prevent bit line contact to bit line contact shorts caused by voids in the insulating layer between adjacent gate conductor lines.

A yet further object is to selectively eliminate voids by selectively increasing the minimum distance between adjacent gate conductor lines in the critical regions where adjacent bit line contacts are also present.

Another further object of the present invention is to eliminate bit line contact to bit line contact shorts while maintaining device performance and not adding to processing complexity.

In accordance with the objects of this invention, a new method of forming gate conductor lines for a DRAM in the manufacture of an integrated circuit device has been achieved. A semiconductor substrate is provided. Active areas are defined in the semiconductor substrate wherein planned DRAM transistors and bit lines will be formed. A gate conductor layer is deposited overlying the semiconductor substrate. The gate conductor layer is patterned to form gate conductor lines. The intersections of the gate conductor lines and the active areas form DRAM transistors. Adjacent gate conductor lines are spaced a first minimum distance in critical regions and are spaced a second minimum distance in non-critical regions. The critical regions are defined as the active areas between adjacent gate conductor lines where bit line contacts are planned. The non-critical regions are defined as areas located between the critical regions and the adjacent gate conductor lines. The second minimum distance is greater than the first minimum distance to thereby decrease the aspect ratio in the non-critical regions to less than the aspect ratio in the critical regions. An insulating layer is deposited overlying the gate conductor lines and the semiconductor substrate. The insulating layer completely fills the non-critical regions without creating voids to thereby eliminate bit line contact to bit line contact shorts without affecting transistor performance and to complete the formation of the gate conductor lines in the manufacture of the integrated circuit device.

Also in accordance with the objects of the present invention, a new DRAM transistor array device is achieved. The device comprises, first, active areas in a semiconductor substrate. Second, bit line contacts to the active areas pass through an insulating layer that overlies the semiconductor substrate. Finally, gate conductor lines overlie the insulating layer and the active areas. The intersection of the gate conductor lines and the active areas form the DRAM transistors. Adjacent gate conductor lines are spaced a first minimum distance in critical regions and are spaced a second minimum distance in non-critical regions. The critical regions are defined as the active areas between the adjacent gate conductor lines wherein the bit line contacts are formed. The non-critical regions are defined as areas located between the critical regions and the adjacent gate conductor lines. The second minimum distance is greater than the first minimum distance to thereby decrease the aspect ratio in the non-critical regions to less than the aspect ratio of the critical regions. Bit line contact to bit line contact shorts are thereby eliminated.

BRIEF DESCRIPTION OF THE DRAWINGS

In the accompanying drawings forming a material part of this description, there is shown.

DESCRIPTION OF THE PREFERRED EMBODIMENTS

The embodiments disclose a method to pattern gate conductor lines for a DRAM circuit in the manufacture of an integrated circuit device. It should be clear to those experienced in the art that the present invention can be applied and extended without deviating from the scope of the present invention.

Figure 1:
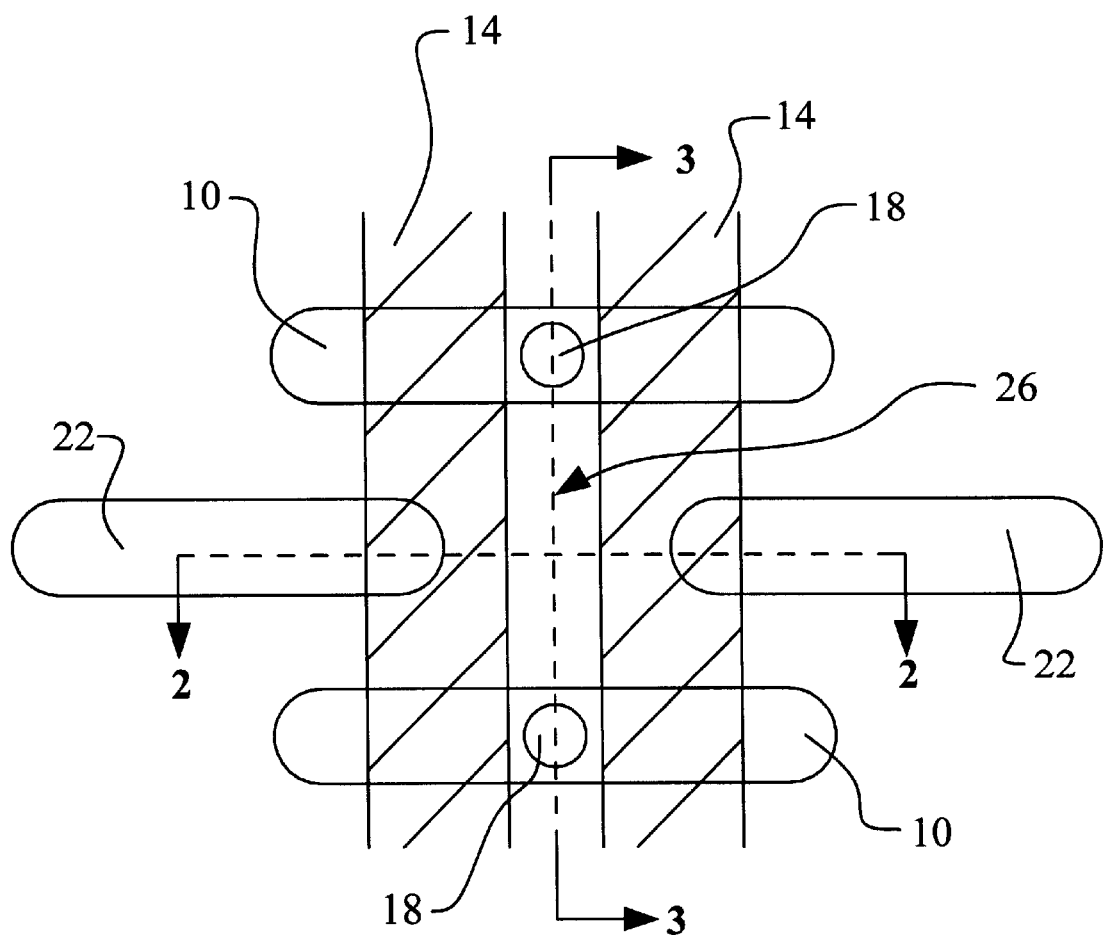
FIG. 1 illustrates a top view of the layout of a partially-completed DRAM circuit.
Figure 2:
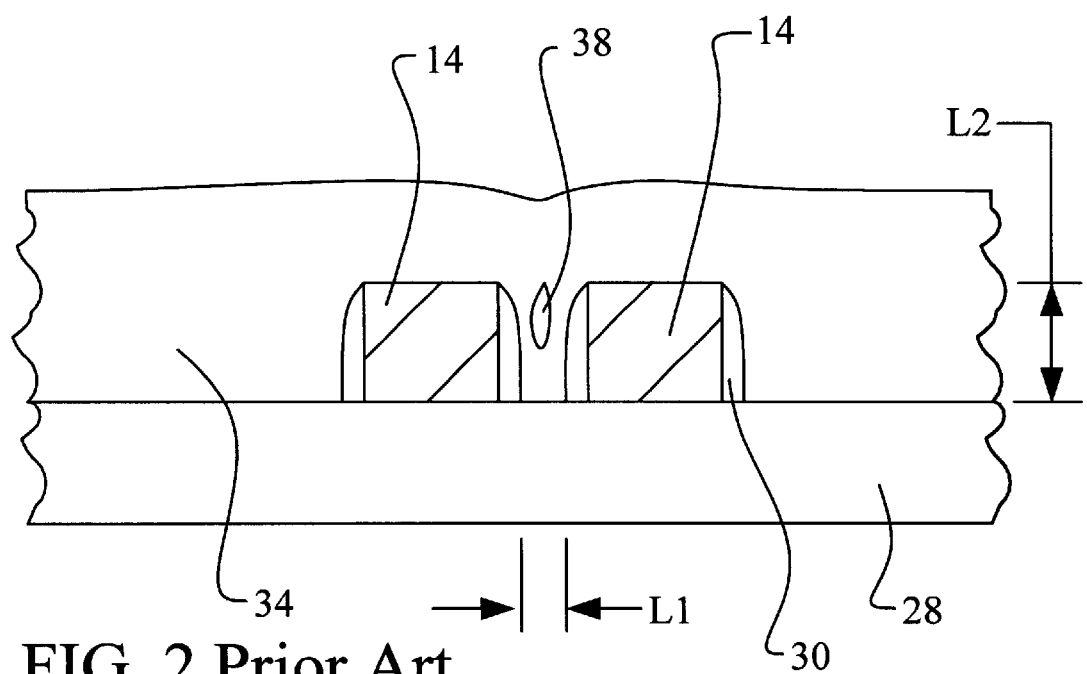
FIGS. 2 and 3 illustrates two cross sectional views of the partially-completed prior art DRAM circuit.
Figure 3:
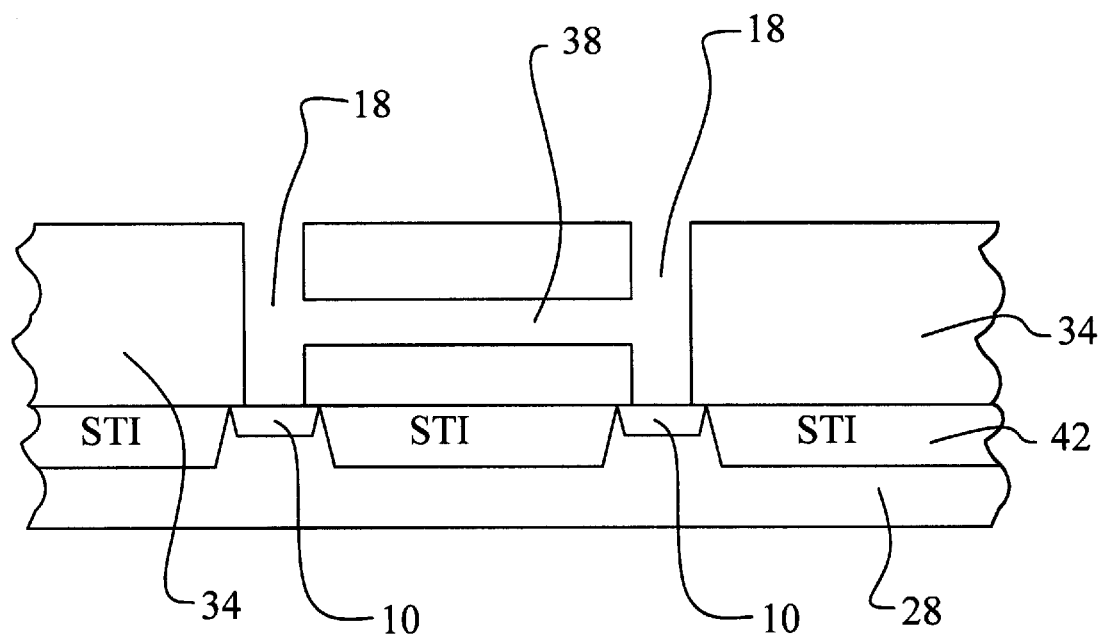
Figure 4:
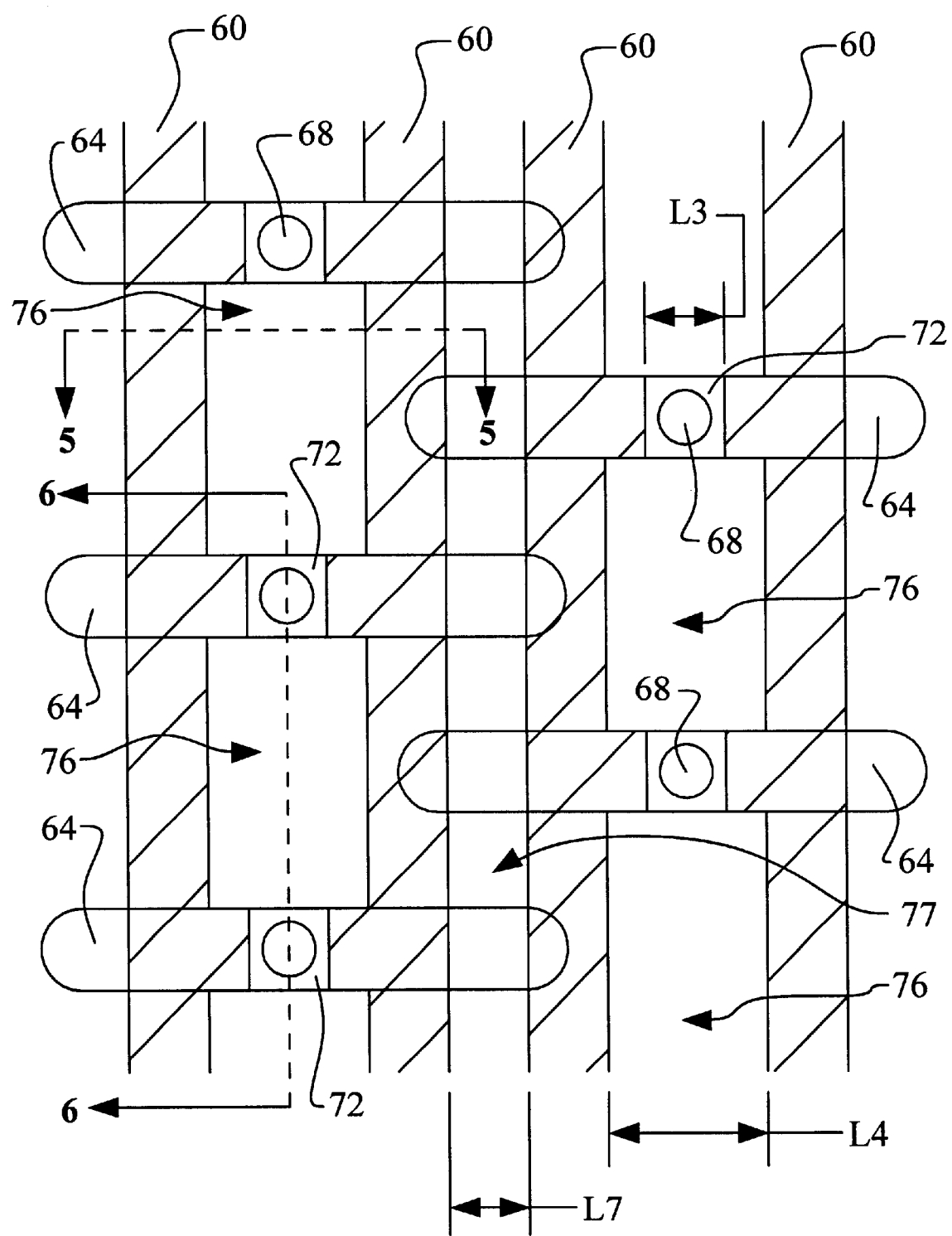
FIG. 4 illustrates a top view of the layout of the preferred embodiment of the present invention.

Referring now particularly to FIG. 4, a top view of the layout of the preferred embodiment of the present invention is illustrated. Several important features of the present invention are presented. In this view, several transistor cells in the DRAM array are depicted. A semiconductor substrate is provided. Active areas 64 are formed in the semiconductor substrate. These active areas 64 are isolated from each other by isolation regions, not shown, comprising either local oxidation of silicon (LOCOS) or shallow trench isolation (STI).

A gate conductor layer 60 is deposited overlying the semiconductor substrate and the active areas 64. This gate conductor layer 60 preferably comprises polysilicon that may be either doped or undoped. Preferably, the gate conductor layer is deposited to a thickness of between about 1,500 Angstroms and 2,000 Angstroms. The gate conductor layer 60 is then patterned to form gate conductor lines 60 as shown. These gate conductor lines 60 run in parallel across the active areas 64.

Note that contacts 68 are planned in the active areas 64. These contacts 68 are called bit line contacts 68 because these provide connectivity between the active areas 64 and the bit lines, not shown. The bit line contacts 68 are made between the adjacent gate conductor lines 60. These active areas 64, where bit line contacts 68 are made to the active areas 64 between adjacent gate conductor lines 60, are defined herein as critical regions 72. The width of the gate conductor line 60 that crosses these critical regions 72 of the active areas 64 is important because it determines the gate length of the transistor.

Note also that non-critical regions 76 are defined herein as areas located between the critical regions 72 and the adjacent gate conductor lines 60.

Most important to the present invention, the spacing between adjacent gate conductor lines 60 is different in the critical regions 72 and in the non-critical regions 76. The critical regions 72 spacing L3 is set to the minimum critical dimension capability for the gate conductor lines in the process. Therefore, the critical regions 72 spacing is called the first minimum distance L3. By using the first minimum distance L3 between adjacent gate conductor lines 60 in the critical regions 72, the transistor performance is maximized while the layout area is kept minimal. By using this minimal spacing L3, it is possible that the subsequently deposited insulating layer will not completely fill the space between the gate conductor lines 60. This does not cause a yield loss, however, because no adjacent bit line contacts are present.

By comparison, in the non-critical regions 76, a second minimum distance L4 is used between the adjacent gate conductor lines 60. This second minimum distance L4 is greater than the first minimum distance L3. Therefore, the aspect ratio in the non-critical regions 76 is greater than in the critical regions 72. By making the aspect ratio larger, the subsequently deposited insulating layer will completely or partially fill the gap between the adjacent gate conductor lines 60 without creating voids. The bit line contact to bit line contact problem of the prior art example is thereby eliminated.

Of particular importance to the present invention is the fact that the gate conductor line 60 spacing is increased only in the non-critical regions 76 and not in the critical regions 72. By maintaining the spacing L3 in the critical regions 72, the transistor performance is not altered. In addition, note that a third region 77 exists where the first minimum distance may be used for spacing L7. Because no bit line contacts 68 are made to the active areas 64 in this third region 77, bit line contact shorting is not a concern.

In the processing sequence for the DRAM device, the gate conductor lines 60 are patterned using a mask laid out in the above method. In this mask, the edges of the gate conductor lines 60 in the non-critical regions 76 are biased downward or moved apart. In the preferred embodiment, the edges of the gate conductor lines 60 in the non-critical regions are moved between about 5 nanometers and 10 nanometers. By selectively biasing the gate conductor line pattern in this way, the aspect ratio is selectively increased in the non-critical regions 76 while leaving the critical regions 72 unaffected. Therefore, the gate length of the transistors are not altered.

A conventional photolithography and etch sequence may be used wherein a photoresist layer, not shown, is deposited overlying a conformal gate conductor layer 60. The photoresist layer is then exposed to actinic light through the gate conductor mask. After development, the photoresist layer serves as a mask for an etching process. For example, the gate conductor layer 60 is etched using a dry plasma etching process. After the gate conductor lines 60 are thereby patterned, the remaining photoresist layer is removed.

Figure 5:
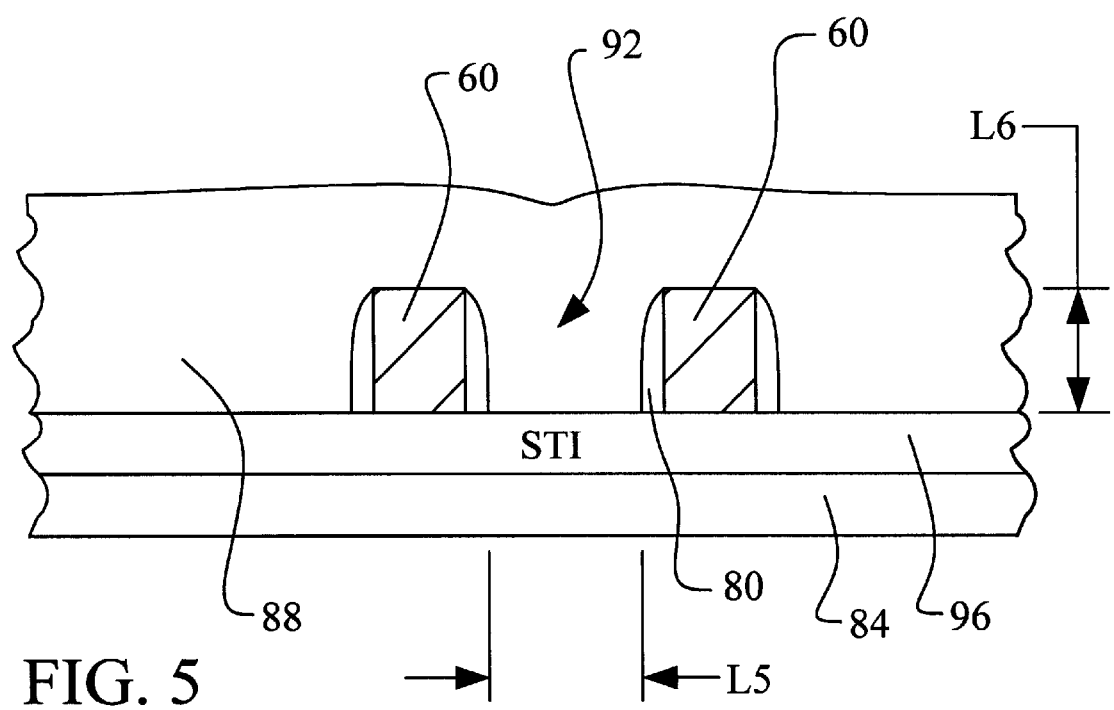
FIGS. 5 and 6 illustrates two cross sectional views of the preferred embodiment of the present invention.

Referring now to FIG. 5, a cross section is shown for the non-critical region 76. This cross section depicts the preferred condition between the adjacent gate conductor lines 60. Note that this region contains no active areas 64. Therefore, a STI region 96 extends across the cross section in the semiconductor substrate 84. Continuing the fabrication process, sidewall spacers 80 may be formed on the gate conductor lines 60. If used, the sidewall spacers 80 facilitate the use of drain extensions to improve the short channel performance of the transistors. In this scheme, lightly doped drain and source extensions, not shown, are ion implanted into the semiconductor substrate 84 in the active areas prior to the sidewall spacer 80 formation. A silicon nitride layer or a silicon dioxide layer is then deposited and etched back using an anisotropic etch process to form sidewall spacers 80. Heavily doped drain and source junctions, not shown, are then ion implanted into the semiconductor substrate 84 in the active areas.

Of particular importance to the present invention, the aspect ratio (L6/L5) in the non-critical region 76 is larger than in the prior art example. The distance L5 between the gate conductor lines 60 has been increased while the gate conductor line height L6 remains constant. Therefore, the aspect ratio (L6/L5) is reduced to less than about 3. By comparison, in the critical regions 72, the aspect ratio is about 4 in the process of the preferred embodiment.

An insulating layer 88 is deposited overlying the gate conductor lines 60 and the semiconductor substrate 84. The purpose of the insulating layer 88 is to electrically isolate the circuit components. The insulating layer 88 may comprise any of the following materials: borophosphosilicate glass (BPSG), spin-on glass (SOG), and high density plasma deposited silicon dioxide (HDP Oxide). In the preferred embodiment, the insulating layer 88 comprises borophosphosilicate glass (BPSG) deposited to a thickness of between about 4,000 Angstroms and 5,000 Angstroms. Note that the decreased aspect ratio (L6/L5) between the adjacent gate conductor lines 60 allows the insulating layer 60 to completely fill the gap 92 without creating a keyhole or void.

Referring back to FIG. 4, bit line contacts 68 are next etched through the insulating layer 88. The bit line contacts 68 allow electrical connectivity between bit lines, not shown, and active areas 64.

Figure 6:
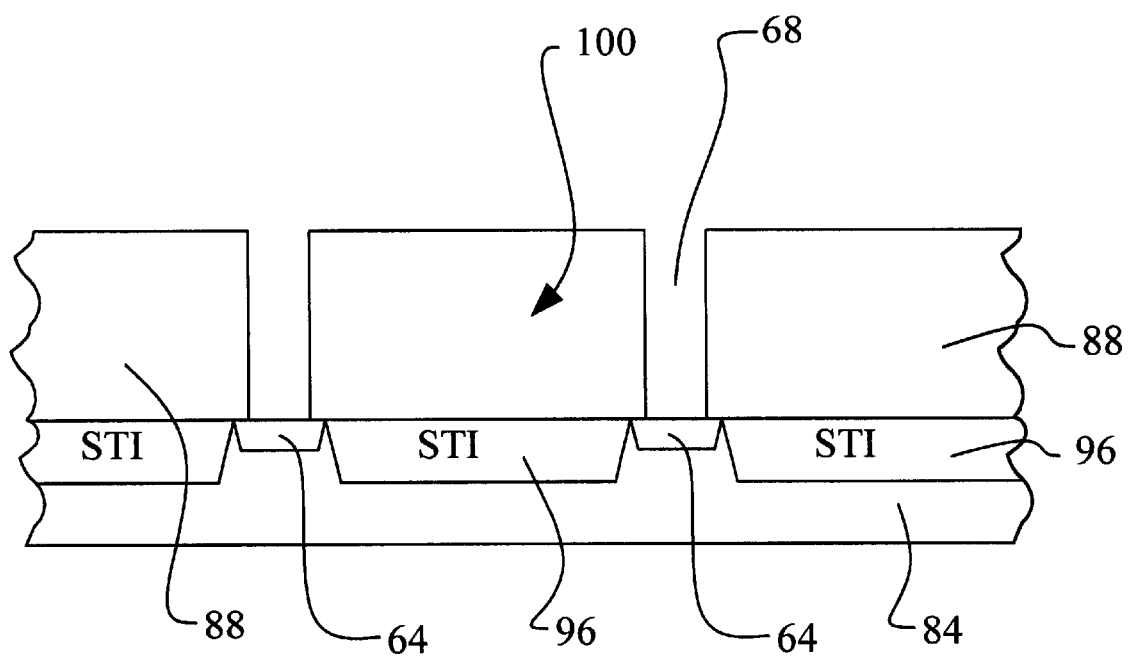

Referring now to FIG. 6, a cross section of the critical region 72 is shown. This cross section depicts the bit line contacts 68 and the preferred condition of insulating layer 88 there between. The bit line contacts 68 open the insulating layer 88 to expose the active area 64. Note that there is no void channel 100 in the insulating layer 88 between the bit line contacts 68. The bit line contacts 68 therefore will remain electrically isolated. Because the gate conductor line spacing in the critical region 72 is smaller, it is possible that some voids or key holes will occur. However, this is not a problem because of the good isolation in the non-critical regions 76.

In subsequent processing, which is not shown, a metal layer is deposited to fill the bit line contacts 68. The metal layer is patterned to form interconnecting lines. Finally, additional levels of insulating levels, interconnecting levels, and passivation may be added to the integrated circuit device.

As shown in the preferred embodiments, the method of the present invention eliminates bit line contact to bit line contact shorts in the DRAM circuit. Selective biasing of the gate conductor pattern increases the gate conductor spacing to facilitate void-free deposition of the insulating layer. The selective nature of the biasing scheme maintains the gate conductor line width overlying the active areas so that DRAM transistor performance is not affected. The yield improvement of the present invention is achieved without altering the standard DRAM process.

While the invention has been particularly shown and described with reference to the preferred embodiments thereof, it will be understood by those skilled in the art that various changes in form and details may be made without departing from the spirit and scope of the invention.

What is claimed is:

1. A method to form conductive lines in the manufacture of an integrated circuit device comprising:

providing a semiconductor substrate having predefined active areas;

depositing a conductive layer overlying said semiconductor substrate and active areas;

patterning said conductive layer to form conductive lines wherein adjacent said conductive lines are spaced a first minimum distance in critical regions and are spaced a second minimum distance in non-critical regions, wherein said critical regions are defined as said active areas between said adjacent conductive lines wherein active area contacts are planned, wherein said non-critical regions are defined as areas located between said critical regions and said adjacent conductive lines, and wherein said second minimum distance is greater than said first minimum distance to thereby decrease the aspect ratio in said non-critical regions to less than the aspect ratio of said critical regions to complete the formation of said conductive lines in the manufacture of said intergrated circuit device.

2. The method according to claim 1 wherein said integrated circuit device comprises a DRAM device.

3. The method according to claim 2 wherein said conductive lines comprise the gate conductor lines for said DRAM device.

4. The method according to claim 2 wherein said active area contacts comprise bit line contacts in said DRAM device.

5. The method according to claim 1 wherein said conductive layer comprises polysilicon.

6. The method according to claim 1 wherein said aspect ratio in said critical regions is about 4.

7. The method according to claim 1 wherein said aspect ratio in said non-critical regions is less than about 3.

8. The method according to claim 1 wherein said conductive layer is deposited to a thickness of between about 1,500 Angstroms and 2,000 Angstroms.

9. The method according to claim 1 further comprising depositing an insulator layer overlying said conductive lines and said semiconductor substrate wherein said insulator layer fills said non-critical regions without creating voids and wherein said depositing is after said step of patterning said conductive layer.

10. The method according to claim 9 wherein said insulating layer comprises one of the group of:

borophosphosilicate glass (BPSG), spin-on glass (SOG), and high density plasma deposited silicon dioxide (HDP Oxide).

11. A method to form gate conductor lines for a DRAM in the manufacture of an integrated circuit device comprising:

providing a semiconductor substrate;

defining active areas in said semiconductor substrate wherein planned DRAM transistors and bit line contacts will be formed;

depositing a gate conductor layer overlying said semiconductor substrate;

patterning said gate conductor layer to form gate conductor lines wherein the intersections of said gate conductor lines and said active areas form said DRAM transistors, wherein adjacent said gate conductor lines are spaced a first minimum distance in critical regions and are spaced a second minimum distance in non-critical regions, wherein said critical regions are defined as said active areas between said adjacent gate conductor lines wherein bit line contacts are planned, wherein said non-critical regions are defined as areas located between said critical regions and said adjacent gate conductor lines, and wherein said second minimum distance is greater than said first minimum distance to thereby decrease the aspect ratio in said non-critical regions to less than the aspect ratio of said critical regions; and depositing an insulating layer overlying said gate conductor lines and said semiconductor substrate wherein said aspect ratio of said non-critical regions allows said insulating layer to fill said non-critical regions without creating voids to thereby eliminate bit line contact to bit line contact shorts and to complete the formation of said gate conductor lines in the manufacture of said integrated circuit device.

12. The method according to claim 11 wherein said gate conductor layer comprises polysilicon.

13. The method according to claim 11 wherein said insulating layer comprises one of the group of:

borophosphosilicate glass (BPSG), spin-on glass (SOG), and high density plasma deposited silicon dioxide (HDP Oxide).

14. The method according to claim 11 wherein said aspect ratio in said critical regions is about 4.

15. The method according to claim 11 wherein said aspect ratio in said non-critical regions is less than about 3.

16. The method according to claim 11 wherein said gate conductor layer is deposited to a thickness of between about 1,500 Angstroms and 2,000 Angstroms.

17. A DRAM transistor array device comprising:

active areas in a semiconductor substrate;

bit line contacts to said active areas through an insulating layer overlying said semiconductor substrate;

gate conductor lines overlying said insulating layer and said active areas wherein the intersection of said gate conductor lines and said active areas form said DRAM transistors, wherein adjacent said gate conductor lines are spaced a first minimum distance in critical regions and are spaced a second minimum distance in non-critical regions, wherein said critical regions are defined as said active areas between said adjacent gate conductor lines wherein said bit line contacts are formed, wherein said non-critical regions are defined as areas located between said critical regions and said adjacent gate conductor lines, and wherein said second minimum distance is greater than said first minimum distance to thereby decrease the aspect ratio in said non-critical regions to less than the aspect ratio of said critical regions to thereby eliminate bit line contact to bit line contact shorts.

18. The method according to claim 17 wherein said gate conductor layer comprises polysilicon.

19. The method according to claim 17 wherein said aspect ratio in said critical regions is about 4.

20. The method according to claim 17 wherein said aspect ratio in said non-critical regions is less than about 3.

* * * * *